US012571865B2

(12) United States Patent
Biber

(10) Patent No.: US 12,571,865 B2
(45) Date of Patent: Mar. 10, 2026

(54) MAGNETIC RESONANCE APPARATUS AND METHOD FOR OPERATING A COOLING APPARATUS IN A MAGNETIC RESONANCE APPARATUS

(71) Applicant: Siemens Healthineers AG, Forchheim (DE)

(72) Inventor: Stephan Biber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 142 days.

(21) Appl. No.: 18/442,403

(22) Filed: Feb. 15, 2024

(65) Prior Publication Data

US 2024/0280656 A1      Aug. 22, 2024

(30) Foreign Application Priority Data

Feb. 16, 2023      (EP) ..................................... 23157044

(51) Int. Cl.
*G01V 3/00*          (2006.01)
*G01R 33/38*          (2006.01)
*G01R 33/3815*          (2006.01)
*G01R 33/56*          (2006.01)
*H01F 6/04*          (2006.01)

(52) U.S. Cl.
CPC ..... *G01R 33/3815* (2013.01); *G01R 33/3804* (2013.01); *G01R 33/5608* (2013.01); *H01F 6/04* (2013.01)

(58) Field of Classification Search
CPC ............ G01R 33/3815; G01R 33/3804; G01R 33/5608; H01F 6/04

USPC ........................................................ 324/318
See application file for complete search history.

(56) References Cited

U.S. PATENT DOCUMENTS

| | | | |
|---|---|---|---|
| 10,823,791 B2 | 11/2020 | Biber | |
| 2019/0154772 A1 | 5/2019 | Ham | |
| 2019/0310333 A1 | 10/2019 | Ham et al. | |

FOREIGN PATENT DOCUMENTS

| | | | | |
|---|---|---|---|---|
| CN | 210811046 U | * | 6/2020 | |
| DE | 102014219741 A1 | * | 3/2016 | ......... G01R 33/3856 |
| EP | 3282271 A1 | * | 2/2018 | ............. G16H 40/63 |
| JP | 6445752 B2 | * | 12/2018 | ............... H01F 6/04 |

* cited by examiner

*Primary Examiner* — Walter L Lindsay, Jr.
*Assistant Examiner* — Frederick Wenderoth
(74) *Attorney, Agent, or Firm* — Banner & Witcoff, Ltd.

(57)          ABSTRACT

The disclosure relates to a magnetic resonance apparatus having a superconducting main magnet, a magnet cooler for the main magnet and a cooling apparatus for the magnet cooler and further components of the magnetic resonance apparatus that are to be cooled. The cooling apparatus has a cooling circuit with a coolant that can be conveyed via a pump for circulation, and the cooling circuit has a first partial circuit to which the magnet cooler is coupled for cooling, at least one second partial circuit for the further components and a common portion, and at least the second partial circuit has a flow rate setting apparatus for setting the coolant flow rate through the partial circuit and associated with the cooling apparatus is a control apparatus, which is configured for actuating the pump and/or the flow rate setting apparatus dependent upon an operating state information item of the magnetic resonance apparatus.

15 Claims, 2 Drawing Sheets

MAGNETIC RESONANCE APPARATUS AND METHOD FOR OPERATING A COOLING APPARATUS IN A MAGNETIC RESONANCE APPARATUS

CROSS-REFERENCE TO RELATED APPLICATIONS

The present application claims priority to and the benefit of is European Patent Application no. EP 23157044.1, filed Feb. 16, 2023, the contents of which are incorporated herein by reference in their entirety.

TECHNICAL FIELD

The disclosure relates to a magnetic resonance apparatus having a superconducting main magnet, a magnet cooler comprising a cold head for the main magnet and a cooling apparatus for the magnet cooler and components of the magnetic resonance apparatus that are to be cooled. The cooling apparatus has a cooling circuit with coolant that can be conveyed by means of a pump for circulation.

In addition, the disclosure relates to a method for operating a cooling apparatus in a magnetic resonance apparatus of this type.

BACKGROUND

Magnetic resonance imaging is an often-used imaging modality within the medical field. Magnetic resonance apparatuses used for this purpose have a large number of components that require cooling by a variety of cooling systems. For example, many magnetic resonance apparatuses use superconducting main magnets, which are cooled by means of a magnet cooler that uses helium and comprises a helium compressor and a cold head. This magnet cooler, in particular its compressor, becomes heated during operation and is therefore often cooled by a cooling apparatus, which is also associated with other components of the magnetic resonance apparatus. Such further components emitting heat during operation of the magnetic resonance apparatus comprise, for example, the gradient coils of a gradient coil arrangement, the associated gradient amplifier, a radio frequency amplifier, electronics coolers using, in particular, air and also components utilized as needed, such as loads for running down the main magnet (run-down loads-RDL). Such cooling apparatuses typically use water as a coolant, which can be provided already cooled and/or be cooled by a cooling unit of the cooling apparatus, for example a heat exchanger. The coolant is circulated by means of a pump in a cooling circuit of the cooling apparatus.

Two fundamental configurations are generally known. In so-called passive cooling apparatuses, the pump circulates the water for cooling the components and the magnet cooler, wherein heat is transferred via a heat exchanger to the primary water of the client. In the so-called active cooling apparatuses, the water is fed, in particular, through a so-called "chiller," which releases heat to the external air.

It is also known, for stabilizing the coolant temperature, to use a mixing battery for the coolant, which mixes hot and cold coolant to achieve a stable and/or desired coolant temperature. This applies, in particular, with regard to a cooling by means of the external air.

SUMMARY

Cooling apparatuses require electrical energy for their operation. With magnetic resonance apparatuses, there exists the particular circumstance that, due to the continuous operation of the main magnet, even with the magnetic resonance apparatus not otherwise in use, a continuous on-going cooling process is necessary. If, for example, a magnetic resonance apparatus has three operating modes, specifically a switched-off operating state, an examination operating state, and a standby operating state, the components to be cooled which have a permanent power requirement, that is, in all of these operating modes, have a particular significance, since the reduction of the power consumption in these components has the greatest effect on the reduction in the energy consumption of the cooling apparatus.

In such cooling apparatuses for magnetic resonance apparatuses, the available cooling power that can be fed to the magnet cooler and the further components is dependent upon various parameters. In the active cooling apparatus, these are, in particular, the properties of the cooling unit, such as the chiller, and the external air, e.g. the ambient air temperature. In a passive cooling apparatus, these are dependent upon the flow rate and the water temperature of the primary water at the installation site. In contrast thereto, the cooling power required by the dynamic operation and the storage properties of the components of the magnetic resonance apparatus, comprising, apart from the aforementioned components, also water in hoses and suchlike, are difficult to predict. In each case, there is a high dynamic level since the exact required cooling power depends heavily upon the current operating state. Between the aforementioned switched-off operating state (4-8 kW base load) and an examination with a simple magnetic resonance sequence, there are only a few kW, whereas between a simple magnetic resonance sequence and an energy intensive magnetic resonance sequence, there are several 10 s of kW.

With regard to the operation of the pump that circulates the coolant in the cooling circuit, to save electrical energy it has previously been proposed to use three pump states that are associated with the three aforementioned operating modes. Therein, the pump power, e.g. the rotary speed of the pump in the switched-off operating state and the standby operating state, is selected to be significantly lower than during an examination. It should be noted that modern pumps, e.g. water circulation pumps in magnetic resonance apparatuses, need approximately 1-2.5 kW of power. This corresponds to a total electrical energy of 8-20 MWh per year. Thus, even a savings in the range of 10-20% would be extremely desirable.

U.S. Pat. No. 10,823,791 describes a method and a magnetic resonance apparatus for monitoring the function of a cooling apparatus of the magnetic resonance apparatus. Herein, temperature sensors are associated with at least a portion of the components of the magnetic resonance apparatus that are cooled by the cooling system, wherein from a starting temperature, a comparison variable is generated and the later temperatures are compared with the comparison variables in order to control the triggering of actions.

It is thus an object of the present disclosure to provide a possibility that is less complex to implement for reducing the energy consumption in cooling apparatuses for magnetic resonance apparatuses.

In order to achieve this object, it is provided according to the disclosure in a magnetic resonance apparatus of the type mentioned in the introduction that the cooling circuit has a first partial circuit to which the magnet cooler is coupled for cooling, at least one second partial circuit for the further components and a common portion in which, e.g. the pump is provided, and wherein at least the second partial circuit has a flow rate setting apparatus for setting the coolant flow rate through the partial circuit and associated with the cooling apparatus is a control apparatus which is configured for actuating the pump and/or the flow rate setting apparatus dependent upon an operating state information item of the magnetic resonance apparatus.

A solution is proposed that enables an energy savings for the specific requirements of a magnetic resonance apparatus for magnetic resonance imaging. These specific requirements are a necessity for continuous cooling of the main magnet by the main cooler, e.g. the cold head of the helium compressor, to meet the demand for cooling of the components needed for the magnetic resonance imaging and the dynamic differences in the heat output.

It is therein specifically proposed to provide, in the cooling circuit of the cooling apparatus, at least two partial circuits that are entirely separate and therefore contain no common portions. The first partial circuit contains at least the components that are needed permanently for cooling, e.g. the magnet cooler. The at least one second partial circuit contains the components that are needed only during the examination operation, that is, during magnetic resonance imaging, and which also tend to emit a dynamic heat load to the cooling apparatus during the examination. Put differently, the further components of the second cooling circuit comprise only the components of the magnetic resonance apparatus used in the examination operation of the magnetic resonance apparatus, and coupled to the first cooling circuit are all the apparatuses necessary for cooling the main magnet, which are grouped together herein under the designation "magnet cooler." The magnet cooler comprises, for instance, at least the cold head and the helium compressor.

In preferred exemplary embodiments, the coolant flow, wherein water for example is used as the coolant, is driven through both the parallel-connected partial circuits via an actuatable pump provided in the common portion. Herein, the actuation of the pump can take place, for example, via a converter. At least for the at least one second partial circuit, it is possible to counteract the coolant flow with a flow resistor and thus likewise regulate the flow rate in a controllable manner, for which purpose the flow rate setting apparatus is provided. If now, for example, the second partial circuit is blocked so that no further flow takes place therein, it is possible to reduce the pump output and nevertheless generate the necessary, e.g. temporally constant, flow rate through the first cooling circuit. This makes it possible to save a significant amount of energy, since the control apparatus can be configured, for example, to block the at least one second partial circuit and reduce the pump output whenever the further components are not required and therefore do not generate any heat that needs to be removed. In this way, for example several 100 W of power can be spared, and thus approximately 0.1 to 1 MWh of energy per year can be saved.

It is also possible in the context of the present disclosure to use more than one pump, for example to provide a pump in each of the partial circuits. Here also pump power can be spared accordingly, since for example pump power can be dispensed with in the blocked second partial circuits. What is particularly advantageous, and is therefore mainly considered in the following, is a solution with exactly one pump in the common portion.

In general, it can be stated that the control apparatus is configured for actuating the pump and/or the flow rate setting apparatus to meet an optimization goal apart from an actuating goal which describes sufficient cooling, wherein the optimization goal is a reduction in the energy usage, e.g.

by the pump. The present disclosure therefore enables a reduction of the energy requirement for the coolant pump, e.g. a water circulating pump, of the cooling apparatus of the magnetic resonance apparatus by way of a division of the cooling circuit and a control of the flow rate of the partial circuits.

For example, the further components can comprise a gradient coil arrangement and/or a gradient amplifier (GPA) and/or a radio frequency amplifier (RFPA) and/or a switch-off load for the main magnet and/or an electronics cooler. These are naturally only examples; all the components of the magnetic resonance apparatus generating a heat output, e.g. during a magnetic resonance examination, that need to be removed can suitably be connected to the at least one second partial circuit for cooling. A switch-off load for the main magnet (i.e. a run-down load (RDL)) can be, for example, an aluminum block or suchlike that is to be used during a planned, targeted run-down of the main magnet. An electronics cooler can comprise, for example, a ventilator used for air cooling of electronics components of the magnetic resonance apparatus, e.g. a fan.

The common portion of the cooling circuit can have at least one cooling unit, e.g. a heat exchanger to the external air for cooling the coolant. Such cooling units are frequently implemented as heat exchangers and/or heat pumps to the external air, so-called "chillers," to utilize the external air. It is also conceivable in the context of the present disclosure to provide a cooling of the coolant, e.g. by means of a heat exchanger, via primary water at the installation site.

Suitably, the flow rate setting apparatus can have at least one valve capable of electronic and/or thermostatic regulation. Generally speaking therefore, the flow rate through the at least one second cooling circuit can be regulated by way of the at least one second cooling circuit by adapting the flow resistance. The flow resistance adjustment can be achieved with at least one adjustable valve. Therein, the adjustable valve can be controlled electronically and/or thermostatically, where in the latter case alone, a largely static control curve results so that the electronic actuating capability, which enables a more complex regulating operation, is preferred. Suitably, for every second partial circuit, two valves can be used, wherein a first valve is arranged at the inlet into the respective partial circuit and a second valve is arranged at the outlet from the respective partial circuit. If the flow rate is reduced, for example in a switched-off operating state of the magnetic resonance apparatus, the at least one valve, e.g. both valves, can be adjusted down completely or almost completely.

In an advantageous embodiment, it can be provided that the operating state information item describes a current operating mode of the magnetic resonance apparatus, where the control apparatus is configured for the selection of a setting associated with the current operating mode at least for the flow rate setting apparatus. This means that when it is determined that a particular operating mode is currently in effect, the control apparatus uses the setting associated with this operating mode, said setting being e.g. stored in a storage means of the storage apparatus to actuate the flow rate setting apparatus accordingly. In this way, a particularly easy usage capability of the partial circuits and the flow rate setting apparatus can be realized in that particular fixed settings dependent upon the operating mode can be made use of, wherein in such an embodiment a setting for the at least one pump can also suitably be associated with the operating modes.

It is however also conceivable that the operating mode and the setting at least of the flow rate setting apparatus for it represents a basis for a further-reaching regulating operation that can then relate, for example, to the pump and/or further cooling apparatus components. It is fundamentally also conceivable to regard the setting for the operating mode as a starting point or the stipulation of a particular control operation, after which a further actuation of the flow rate setting apparatus in a regulating operation can also follow.

In a specific embodiment, it can be provided that at least one of the operating modes is selected from a group comprising a switched-off state, a standby state, and an examination state, wherein:

a setting of the flow rate setting apparatus permitting less than 10% of the maximum flow rate, e.g. a no flow rate, is associated with the switched-off state;

a setting of the flow rate setting apparatus permitting more than 90% of the maximum flow rate, e.g. a maximum flow rate, is associated with the examination state; and a setting of the flow rate setting apparatus permitting a flow rate lying between the permitted flow rate in the switched-off state and the permitted flow rate in the examination state is associated with the standby state.

As an example, in this regard, on the basis of the lower flow rate through the at least one second partial circuit, a reduced pump output is assigned compared with the examination state, which is also reduced compared with the pump output that would be required if both the first and also the second partial circuit had full flow through them. It should therein be noted that it is, in principle, conceivable to use the same flow rate in the standby state as in the switched-off state, although an at least slightly increased flow rate is advantageous.

As mentioned before, generally speaking a setting of the pump can also be associated with any operating mode. In this way, even in a simple embodiment without a further-reaching regulating operation with regard to the flow rate setting apparatus and/or the pump, a significant reduction of the energy requirement is possible.

However, advantageous exemplary embodiments are also achieved if the control apparatus is configured, within at least one operating mode, for actuating the pump in the context of a regulating operation. For example, it is conceivable in one embodiment that specifies a particular flow rate through the at least one second partial circuit for each operating mode by means of a particular setting of the flow rate setting apparatus, but which uses a regulating operation within the operating mode with regard to at least the pump, which enables a further reduction in the energy consumption of the pump.

Also in general, however, in combination with settings associated with operating modes, or without using said settings, it can be provided that the control apparatus is configured for a continuous regulating operation of the cooling apparatus, e.g. with regard to at least one target temperature. Therein, in the regulating operation, suitably at least the pump and the flow rate setting apparatus are actuated for implementing the regulation, although possibly also further cooling apparatus components. For example, it is therefore conceivable in examination operation, that is, during magnetic resonance imaging, not to circulate the maximum flow through the second partial circuit as is conventional, but rather to reduce the flow level to the actual need and correspondingly to regulate the pump downwardly to save energy.

Specifically, it can be provided that the operating state information item used for regulating operation comprises:

at least one temperature measured in the cooling circuit and/or in or on the magnet cooler and/or in or on at least one further component by means of a temperature sensor of the magnetic resonance apparatus; and/or an external temperature and/or an external air humidity of an external air used, e.g. for cooling the coolant and/or at least one heat output information item established predictively and/or from past usage processes per component and/or group of components.

The temperature measurement values of different temperature sensors can serve as input variables into the regulation, e.g. for actuating the flow rate setting apparatus. In an example electronic regulation, many temperatures can be used, for example temperature sensors of the at least one second partial circuit, temperature sensors of the components themselves, and/or coolant temperatures in the common portion, e.g. of the coolant cooled by the at least one cooling unit. Therein, the use of temperature sensors of the components is suitable in that with a very low flow rate, a component can possibly be warm before this is visible in the coolant, that is in temperature measurement values of the second partial circuit. If the temperature on or in components is used, such a temperature rise can be determined early and, for example, the flow rate can be increased and/or another regulating measure can be taken. For instance, the temperatures on or in components and coolant temperatures, e.g. in the second cooling circuit, can be input together into the regulating algorithm used in the control apparatus for the regulating operation. This enables the time constants of the individual components also to be taken into account in the regulating loop. Thus, it can be provided that the temperature rise at individual temperature sensors is used in regulating operation, e.g. to establish or estimate time constants.

Especially in examination operation, that is, if dynamically changing heat output levels for instance at the further components that are connected to the second partial circuit can occur, it can be suitable already to know the required cooling power, e.g. predictively (at least as an estimate) before the heat development is able to be measured, for example, by means of temperature sensors. For this purpose, further parameters of the magnetic resonance apparatus can be utilized in a regulating algorithm used for implementing the regulating operation. Such portions of the operating state information item can be used to establish predictively and/or by making use of past usage processes, a heat output information item, e.g. per component and/or per group of components. For example, it can be provided that the control apparatus is configured for establishing the heat output information item from input data using a performance model stored in the control apparatus and/or using a trained establishing function of artificial intelligence, said establishing function being stored in the control apparatus.

The input data can therein be selected from the group comprising:

sequence data describing at least one magnetic resonance sequence to be used in future;

examination data describing an examination type, e.g. describing a clinical query and/or a body region to be examined, and/or patient data describing a patient to be examined, e.g. an age and/or a sex and/or a weight.

Therein, it should firstly be pointed out that conventionally performance models for predicting electric power levels required and/or heat output levels arising have been proposed that can also be used accordingly in the context of the present disclosure. In this context, it is particularly advantageous in general, if a series of a plurality of magnetic resonance sequences to be used in future is known, to extend corresponding advance calculations not only to the next sequential magnetic resonance, but to a plurality, e.g. to all, magnetic resonance sequences of the series. Then, the corresponding advance calculated states of the magnetic resonance apparatus arising at the end of a magnetic resonance sequence can be used as a starting state for the subsequent magnetic resonance sequence.

It is also conceivable, if magnetic resonance sequences use a preparation step in the magnetic resonance apparatus, to retrieve input data established in the preparation step as the operating state information item in the magnetic resonance apparatus for a magnetic resonance sequence that has been started and to derive the power requirements for the run time of the magnetic resonance sequence, for example 1 to 5 minutes. As already mentioned, however, for magnetic resonance sequences still situated in a queue, a pre-calculation can be used to estimate the expected heat output levels and thus the likely cooling power levels required. Therein, input data relating to magnetic resonance sequences, that is, operating state information items, can be kept simple, for example, as a sequence type and/or a sequence name, but can also be more dedicated, for example, describing pulse sequences. Generally speaking, to estimate the heat output and thus the cooling power required for a currently running or future magnetic resonance sequence, information relating to the body region that is to be examined and/or regarding the patient can also be used to improve the advance calculation/estimation. For example, it is also conceivable in this regard to use a trained establishing function of artificial intelligence, said establishing function being stored in the control apparatus to be able to map more complex associations.

In general, a trained function maps cognitive functions that humans associate with other human brains. By way of training based upon training data (e.g. machine learning), the trained function is capable of adapting itself to new circumstances and of detecting and extrapolating patterns.

In general, parameters of a trained function can be adapted by means of training. For example, supervised learning, semi-supervised learning, unsupervised learning, reinforcement learning, and/or active learning can be used. In addition, representation learning (also known as "feature learning") can be used. The parameters of the trained function can be adapted, e.g. iteratively, by way of a plurality of training steps.

A trained function can comprise, for example, a neural network, a support vector machine (SVM), a decision tree, and/or a Bayesian network, and/or the trained function can be based upon k-means clustering, Q-learning, genetic algorithms, and/or assignment rules. As an example, a neural network can comprise a deep neural network, a convolutional neural network (CNN), or a deep CNN. Furthermore, the neural network can comprise an adversarial network, a deep adversarial network, and/or a generative adversarial network (GAN).

In a suitable development, the magnet cooler can be capable of regulation by means of a control unit, wherein the operating state information item comprises a regulating information item provided by the control unit. This regulating information item can be evaluated, for instance, in the switched-off state and/or in the standby state, for adapting the pump output of the pump. In this way, different approaches to saving electrical energy in magnetic resonance apparatuses can be brought together, since it has previously been proposed, for reducing the energy requirement, also to adapt the operation of the magnet cooler, e.g. the helium compressor, to the actual cooling power requirement of the main magnet. For example, in this regard, it can be provided that the magnet cooler is switched on and off with a particular timing. A further approach is the regulation of the magnet cooler by controlling the rotary speed, for example in the case of a converter.

In both procedures, the necessary cooling power of the cooling apparatus by way of the coolant would also vary dependent upon the actuation of the magnet cooler. If a reaction to these variations now takes place by means of the control apparatus by a suitable adaptation of the pump output, if less cooling power is required for the magnet cooler, said pump output can then be reduced so that further energy can be saved. For this purpose, the regulating information item can be used by the control unit of the magnet cooler. It should be noted therein that this embodiment, adaptation of the pump output to the cooling power actually required at the magnet cooler, is advantageous also independently of the provision of partial circuits for different components of the magnetic resonance apparatus and can be realized accordingly.

As already mentioned, a conventional technique includes using an actuatable mixing battery for mixing cold and hot coolant. This can also take place in the context of the present disclosure, wherein suitably the actuatable mixing battery can accordingly be linked into the control system by way of the control apparatus. It can specifically be provided that the common portion has an actuatable mixing battery for mixing coolant in the supply flow to the partial circuits from coolant in the supply flow and in the return flow from a cooling unit, e.g. the heat exchanger, for the coolant, wherein the control apparatus is also configured, e.g. during regulating operation, for actuating the mixing battery dependent upon the operating state information item.

In a suitable development of the present disclosure, it can further be provided that the control apparatus is configured for training and using a self-learning algorithm for establishing settings that are to be used for the pump and/or the flow rate setting apparatus. Therein, a large number of specific configurations are conceivable to draw conclusions in a learning manner during operation of the cooling apparatus, wherein the self-learning algorithm can also comprise, for instance, a trained function of artificial intelligence. Herein, it is for example conceivable to predict from the past a behavior in the future that is to be expected from the user of the magnetic resonance apparatus, so that in this regard also, an estimation of the required cooling power can be made. Particularly advantageously however, by means of the self-learning algorithm, e.g. as a self-learning system of the artificial intelligence, the control apparatus can always further optimize the energy saving in a self-learning manner in that the back regulation of the pump together with the control of the flow rate in at least one second cooling circuit is tested ever further until the tolerance limits are exceeded.

Differently expressed, it can be provided that the control apparatus is configured, during training for temporal changing of at least one setting, e.g. outside the examination operation, of the pump and/or the flow rate setting apparatus until a tolerance temperature in the cooling circuit and/or on or in the magnet cooler and/or on or in at least one of the further components is exceeded. The at least one tolerance temperature is therein suitably selected so that furthermore, even on slight exceeding, a reliable operation of the magnetic resonance apparatus is possible. Only a second, higher tolerance temperature leads to error messages and/or instances of switch-offs. In this way, the control apparatus itself learns over time how an optimal saving of energy, e.g. for the pump, can take place.

A suitable development of the present disclosure provides that a plurality of second partial circuits are provided with respective flow rate setting apparatuses for cooling subgroups of the further components. It is also possible to provide a plurality of second partial circuits independently capable of regulation in order to enable a yet finer adjustability and in particular "disconnection ability" of components to be cooled in second circuits. It is then conceivable, for example, if only a part of the further components is needed, to provide further coolant circulation only for these and to adjust down other second partial circuits, so that then e.g. a reduction of the pump output can take place. Specifically, it can be provided herein that the distribution of the further components into subgroups is based at least partially upon a local proximity of components and/or a temporally correlating use of components. This is preferred if further components with a similar temporal cooling power requirement are connected to the cooling in the same partial circuit. It is thus to be expected that the further components of the corresponding subgroup also require cooling at similar time intervals and, at similar time intervals, can be temporarily disconnected from the cooling. An at least partial spatial association can also be carried out to improve the laying of lines for the partial circuits. For example, a first subgroup can comprise gradient coils and a switch-off load for the main magnet, and a second subgroup can comprise the gradient amplifier, the radio frequency amplifier, and an electronics cooler.

Apart from the magnetic resonance apparatus, the present disclosure also relates to a method for operating a cooling apparatus in a magnetic resonance apparatus according to the disclosure, which is distinguished in that the control apparatus actuates the pump and/or the flow rate setting apparatus dependent upon an operating state information item of the magnetic resonance apparatus. All the statements relating to the magnetic resonance apparatus according to the disclosure can be transferred similarly to the method according to the disclosure, with which the above mentioned advantages can therefore also be achieved, and vice-versa.

BRIEF DESCRIPTION OF THE DRAWINGS

Further advantages and details of the present disclosure are disclosed in the exemplary embodiments described below and by reference to the drawings. In the drawings.

DETAILED DESCRIPTION OF THE DISCLOSURE

Figure 1:
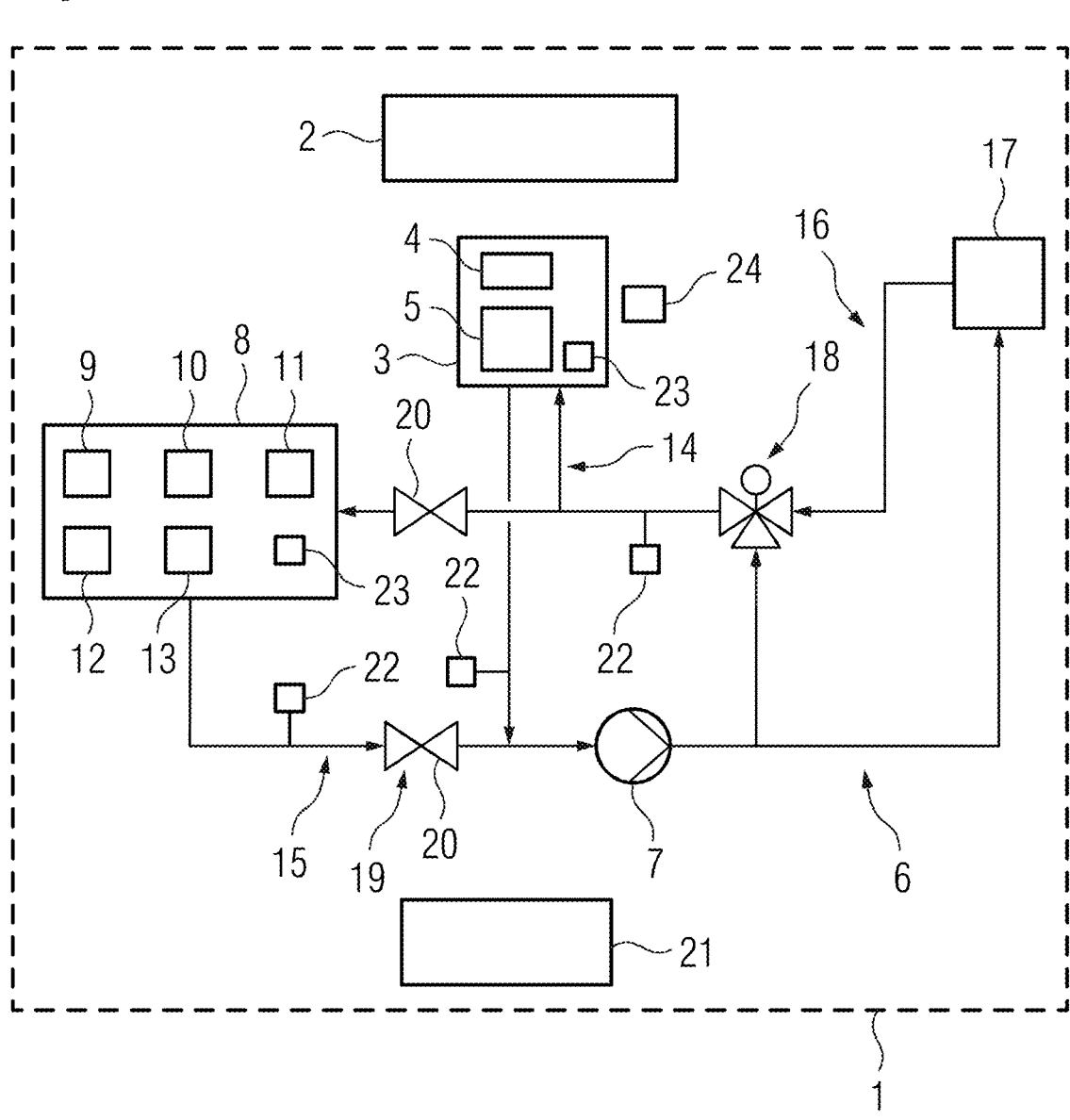
FIG. 1 illustrates a block diagram of example components of a magnetic resonance apparatus in accordance with a first embodiment.

FIG. 1 illustrates a block diagram of example components of a magnetic resonance apparatus in accordance with a first embodiment. The magnetic resonance apparatus 1 comprises a superconducting main magnet 2, associated with which is a magnet cooler 3 with a cold head 4 and a helium compressor 5 for cooling. The magnet cooler 3, e.g. the helium compressor 5, requires cooling, so the magnetic resonance apparatus 1 comprises a cooling apparatus (also referred to herein as a cooler) with a cooling circuit 6 in which coolant (e.g. water) circulates, and is driven by a pump 7. The cooling apparatus is also configured for cooling further components 8 of the magnetic resonance apparatus 1 of which, in the present case include, for example, a gradient coil arrangement 9, a gradient amplifier 10, a radio frequency amplifier 11, a switch-off load 12 for the main magnet 2, and an electronics cooler 13 as shown. Whereas the superconducting main magnet 2 needs to be cooled constantly, i.e. also in a switched-off state of the magnetic resonance apparatus 1, the further components 8 are not always used, but rather, as far as the gradient coil arrangement 9, the gradient amplifier 10, the radio frequency amplifier 11, and the electronics cooler 13 are concerned, may e.g. only be cooled during an examination with the magnetic resonance apparatus 1, that is a magnetic resonance imaging. Naturally, further components 8 that need cooling are also conceivable.

The cooling circuit 6 of the cooling apparatus is divided, in the present case, into a first partial circuit 14 in which the magnet cooler 3 is cooled, a second partial circuit 15 in which the further components 8 are cooled, and a common portion 16. The common portion 16 may comprise, apart from the pump 7, a cooling unit 17, for example a chiller that can comprise a heat exchanger and/or a heat pump to the external air. Further provided in the common part 16 is a mixing battery 18 that can be actuated for mixing cold water of the cooling unit 17 with hot water from the return flows of the partial circuits 14, 15.

The second partial circuit 15 comprises a flow rate setting apparatus 19 which, in the present case, has two electronically controllable valves 20, one in the supply flow path and one in the return flow path. By means of the valves 20, the flow rate through the second partial circuit 15 can be adjusted.

The operation of the cooling apparatus is controlled by means of a control apparatus 21 (also referred to herein as a controller) which, in the present case, can actuate the flow rate setting apparatus 19, i.e. the valves 20, the pump 7, and the mixing battery 18. This takes place on the basis of an operating state information item. The control therein takes place in that, firstly, as the actuation aim, a sufficient cooling of the magnet cooler 3 among other components 8 is achieved. Secondly however, as an optimizing goal, the energy requirement e.g. for the pump 7 is reduced.

As an example, as far as the flow rate setting apparatus 19 is concerned, both relatively simple and also relatively complex concepts are conceivable, wherein it is possible, for example, that the settings for the flow rate setting apparatus 19 and the pump 7 already follow from an existing operating mode and the regulating operation relating to the temperature takes place at least mainly by way of actuating the mixing battery 18. Therein, as the operating modes, for example, a switched-off state, a standby state, and an examination state are conceivable, wherein in the switched-off state in which only the magnet cooler 3 requires cooling by reason of the continuous cooling requirement for the main magnet 2, the valves 20 can be set to a very low flow rate, e.g. to provide no flow at all. Accordingly, the pump output of the pump 7 can be reduced, since the coolant must now only be fed through the first partial circuit 14, but no longer through the second partial circuit 15. A similar setting can be used in the standby state, wherein in this case a slight opening of the valves 20 can already be provided. In the examination state, however, the valves 20 are open to also enable a cooling of the further components 8 in the second partial circuit 15, which warm up during the magnetic resonance imaging process.

However, it is particularly advantageous if the pump 7 and also the flow rate setting apparatus 19 are included in the regulating operation, which can take place additionally or alternatively to the settings for the different operating modes.

It is suitable therein if the operating state information item upon which the control in the control system 21 is based is as comprehensive as possible such that an overall picture arises that clearly describes the necessary cooling power levels, and thus reveals the savings potential for the control apparatus 21.

As a first source of operating state information, the magnetic resonance apparatus 1 comprises temperature sensors 22 for measuring the coolant temperature in the cooling circuit 6, wherein purely exemplary possible positions are shown and, naturally further or alternate temperature sensors 22 can be provided, as well as temperature sensors 23 for measuring the temperature at and/or in the further components 8 and possibly the magnet cooler 3. For example, during the examination operation, energy saving potential exists in that the cooling no longer circulates the maximum coolant flow rate through the second cooling circuit 15 as is the case for conventional systems, but rather the flow quantity is reduced to the actual need. And, in parallel, the pump 7 is correspondingly regulated down, and therefore is operated at a lower pump power level.

In general, however, as input variables for such a regulating operation, but also for other types of regulating operation, temperature measurement values from the temperature sensors 22, 23 are made of use. Herein, the temperature sensors 23 on or in the further components 8 are particularly useful since, with a very low flow rate of coolant in the second partial circuit 15, a further component 8 can possibly warm up before this is measurable via the corresponding sensor 22 in the return flow of the second partial circuit 15. By way of the use of the temperature measurement values of the temperature sensors 23 of the further components 8 in the regulating algorithm, a temperature rise can be sensed early and, given a temperature rise, this information may be used to increase the flow rate by actuating the flow rate setting apparatus 19. Suitably, the temperature measurement values of the further components 8 and the coolant temperature in the second partial circuit 15 together enter into the regulating algorithm so that time constants and difference temperatures, e.g. temperature rises at individual temperature sensors 22, 23, can be estimated correctly and taken into account.

Additionally or alternatively, the operating state information item can describe required cooling power levels that are to be expected directly or indirectly, or correspondingly occurring heat output levels in the further components 8. Specifically, it can be provided that the control apparatus 21 establishes a heat output information item for the further components 8 from input data contained in the operating state information item, for which purpose, a performance model stored in the control apparatus 21 and/or a trained establishing function of the artificial intelligence stored in the control apparatus 21 can be used.

The input data can therein comprise sequence data describing a magnetic resonance sequence currently being played out and/or to be used in the future, examination data describing an examination type, and/or patient data describing a patient to be examined. For a magnetic resonance sequence already started, power requirements for the runtime of the magnetic resonance sequence can be derived, for example, from a preparation step ("Sequence Prepare") and therefrom heat output information items for the further components 8 can be established. An advance calculation can also take place for pre-planned magnetic resonance sequences. Dependent upon the information available in the control apparatus 21 itself and the nature of the performance model or of the establishing function, sequence data can include, generally speaking, a sequence type and/or a sequence name and/or pulse data describing the pulse train of the magnetic resonance sequence. For the estimation of the heat output arising and thus the cooling power required across currently running and/or future sequences, the control apparatus 21 can also use examination data, for example a body region to be investigated and/or a clinical query, as well as patient data, for example, an age and/or a sex and/or a weight of the patient.

Also generally useful as operating state data, e.g. if a cooling of the coolant takes place using external air, are the external air temperature and/or the external air humidity, since then for example, an estimation of the cooling power available can take place.

In the present exemplary embodiment, the control of the control apparatus 21 is also linked to energy-saving measures with regard to the magnet cooler 3, which are brought about by a control unit 24 (also referred to herein as processing circuitry or a further controller). This energy requirement saving in relation to the magnet cooler 3 can therein follow two different approaches. Firstly, it is conceivable to switch the magnet cooler 3 on and off intermittently, for example in a cycle, the time spacings of which being greater than ten minutes. Additionally or alternatively, the magnet cooler 3, e.g. the compressor 5, can also be regulated for instance by controlling the rotary speed via a converter. In both cases, the cooling power required for the magnet cooler 3 by way of the cooling apparatus also oscillates accordingly. Since the control unit 24 provides a corresponding regulating information item to the control apparatus 21 as an operating state information item, the pump power can be adapted according to the actually needed cooling requirement of the magnet cooler 3 to achieve further energy savings.

Figure 2:
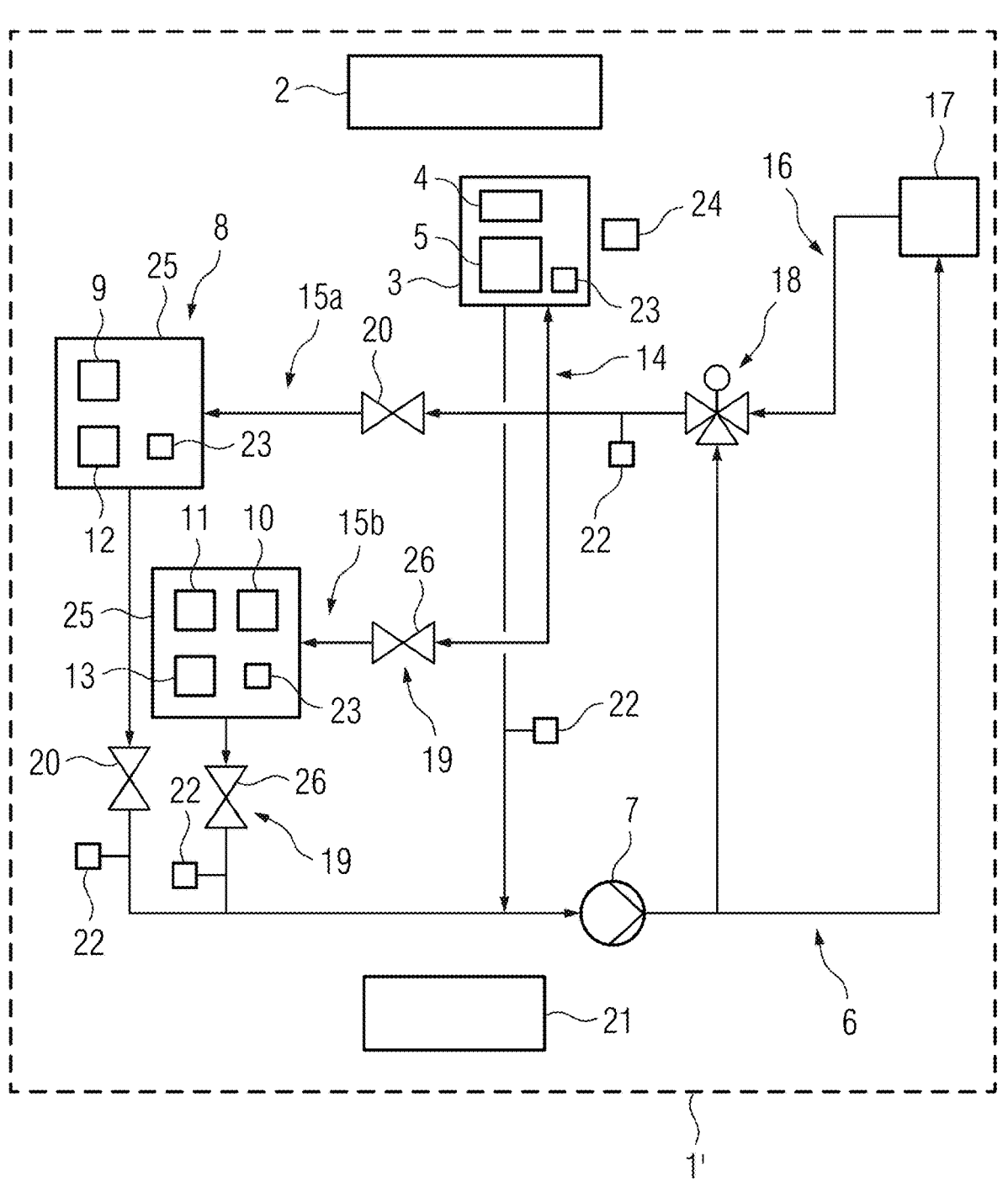
FIG. 2 illustrates a block diagram of example components of a magnetic resonance apparatus in accordance with a second embodiment.

FIG. 2 illustrates a block diagram of example components of a magnetic resonance apparatus in accordance with a second embodiment. FIG. 2 illustrates the second embodiment of a magnetic resonance apparatus 1' according to the disclosure, modified in relation to FIG. 1. In contrast to FIG. 1, the further components 8 are herein divided into two subgroups 25, each of which is connected to one of two second partial circuits 15a, 15b. Each of the second partial circuits 15a, 15b is able to be adjusted down via its own flow rate setting apparatus 19 in the coolant flow, the second partial circuit 15a, via the valves 20 and the second partial circuit 15b via the valves 26.

The specific components 8 in the subgroups 25 are grouped together due to heat output generated that is temporally correlated and/or within a spatial proximity. This means, for instance, that at least a part of the further components 8 of each subgroup 25 has a similar temporal cooling power requirement. Shown in the present case, by way of example, as members of the subgroup 25 of the first second partial circuit 15a are the gradient coil arrangement 9 and the switch-off load 12, and as components of the subgroup 25 of the second second partial circuit 15b, the gradient amplifier 10, the radio frequency amplifier 11, and the electronics cooler 13.

On the basis of the cooling power requirement in the partial circuits 15a, 15b in different time periods, by way of a separate flow rate control system, energy savings can also be achieved, for example with regard to the pump output.

As far as the other components and control and regulation possibilities of the control apparatus 21 are concerned, reference is made to the statements regarding the first exemplary embodiment.

For both exemplary embodiments, the control apparatus 21 can also have a self-learning algorithm that can comprise a trained function of artificial intelligence to learn further optimization possibilities for the energy requirement, e.g. with regard to the pump 7. As an example, the self-learning system constructed in this way can further optimize the energy saving in a self-learning manner in that the regulating down of the pump 7, together with the separation of at least one of the second partial circuits 15, 15a, 15b, is "tested" ever further until critical tolerance temperatures, for example at the further components 8 (temperature sensors 23) or on the coolant (temperature sensors 22), exceed a tolerance temperature that still permits reliable operation and is selected to be lower than a higher tolerance limit, which leads to error messages or switch-offs. In this way, the control apparatus 21 itself sounds out the possible limits by means of the self-learning algorithm. The self-learning algorithm can, generally speaking, access all the required input information that is required, for example including the aforementioned sequence data, examination data, and/or patient data.

Although the disclosure has been illustrated and described in detail by way of the preferred exemplary embodiment, the disclosure is not restricted by the examples disclosed and other variations can be derived herefrom by a person skilled in the art without departing from the protective scope of the disclosure.

Independent of the grammatical term usage, individuals with male, female or other gender identities are included within the term.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A magnetic resonance apparatus, comprising:
a superconducting main magnet;
a magnet cooler configured to cool the superconducting main magnet;
a cooling apparatus configured to cool the magnet cooler and further components of the magnetic resonance apparatus; and
a controller associated with the cooling apparatus,
wherein the cooling apparatus comprises a cooling circuit having a coolant that is circulated via a pump, the cooling circuit comprising:
a first partial circuit to which the magnet cooler is coupled for cooling;
a second partial circuit for cooling the further components of the magnetic resonance apparatus; and
a common portion that is common to the first partial circuit and to the second partial circuit, wherein the common portion comprises an actuatable mixing battery configured to mix (i) coolant provided via a heat exchanger, with (ii) coolant provided via a return flow from the first and the second partial circuits to thereby provide coolant for a supply flow of the first and the second partial circuits,
wherein the second partial circuit has a flow rate setting apparatus configured to set a coolant flow rate through the first partial circuit and the second partial circuit, and
wherein the controller is configured to:
actuate the pump and/or the flow rate setting apparatus dependent upon an operating state information item of the magnetic resonance apparatus; and
as part of a regulating operation, to actuate the mixing battery dependent upon the operating state information item.

2. A method for operating a cooling apparatus in a magnetic resonance apparatus including a superconducting main magnet that is cooled via a magnet cooler, the method comprising:
providing a cooling circuit for the cooling apparatus having a coolant that is circulated via a pump;
providing a first partial circuit of the cooling circuit to which the magnet cooler is coupled for cooling;
providing a second partial circuit of the cooling circuit for cooling further components of the magnetic resonance apparatus;
providing a common portion of the cooling circuit that is common to the first partial circuit and the second partial circuit,
wherein the common portion comprises an actuatable mixing battery configured to mix (1) coolant provided via a heat exchanger, with (ii) coolant provided via a return flow from the first and the second partial circuits to thereby provide coolant for a supply flow of the first and the second partial circuits,
setting, via a flow rate setting apparatus of the second partial circuit, a coolant flow rate through the first partial circuit and the second partial circuit; and
cooling, via the cooling apparatus, the magnet cooler and further components of the magnetic resonance apparatus by actuating, via a controller, the pump and/or the flow rate setting apparatus dependent upon an operating state information item of the magnetic resonance apparatus,
wherein the controller is further configured, as part of a regulating operation, to actuate the mixing battery dependent upon the operating state information item.

3. The magnetic resonance apparatus as claimed in claim 1, wherein the flow rate setting apparatus comprises at least one valve configured to perform electronic and/or thermostatic regulation.

4. The magnetic resonance apparatus as claimed in claim 1, wherein the operating state information item describes a current operating mode of the magnetic resonance apparatus, and
wherein the controller is configured to select a setting for the flow rate setting apparatus based upon the current operating mode of the magnetic resonance apparatus.

5. The magnetic resonance apparatus as claimed in claim 1, wherein the controller is configured to provide a continuous regulating operation of the cooling apparatus with respect to at least one target temperature.

6. The magnetic resonance apparatus as claimed in claim 1, wherein the controller is configured to train and use a self-learning algorithm to determine the settings to be used for the pump and/or the flow rate setting apparatus.

7. The magnetic resonance apparatus as claimed in claim 1, wherein the second partial circuit is from among a plurality of second partial circuits, each one of the plurality of second partial circuits comprising a flow rate setting apparatus for cooling respective subgroups of the further components.

8. The magnetic resonance apparatus as claimed in claim 1, wherein the pump is disposed in the common portion of the cooling circuit.

9. The magnetic resonance apparatus as claimed in claim 4, wherein:

the operating mode of the magnetic resonance apparatus comprises one of a switched-off state, a standby state, or an examination state, a setting of the flow rate setting apparatus of the second partial circuit permitting less than 10% of a maximum flow rate is associated with the switched-off state, a setting of the flow rate setting apparatus of the second partial circuit permitting greater than 90% of the maximum flow rate is associated with the examination state, and a setting of the flow rate setting apparatus of the second partial circuit permitting a flow rate between the permitted flow rate in the switched-off state and the permitted flow rate in the examination state is associated with the standby state.

10. The magnetic resonance apparatus as claimed in claim 4, wherein a setting of the pump is associated with each respective operating mode of the magnetic resonance apparatus.

11. The magnetic resonance apparatus as claimed in claim 4, wherein the controller is configured, within at least one of the operating modes of the magnetic resonance apparatus, to actuate the pump as part of the regulating operation.

12. The magnetic resonance apparatus as claimed in claim 5, wherein the operating state information item comprises one or more of:

at least one temperature of (i) the cooling circuit, (ii) the magnet cooler, and/or (iii) at least one further component, the at least one temperature being measured via a respective temperature sensor of the magnetic resonance apparatus;

a temperature and/or humidity of air used for cooling the coolant; and/or at least one heat output information item that is (i) established predictively and/or from past usage processes per component, and/or (ii) established from past usage processes per a group of components.

13. The magnetic resonance apparatus as claimed in claim 5, wherein the magnet cooler is configured to perform regulation via a further controller, and wherein the operating state information item comprises a regulating information item provided by the further controller.

14. The magnetic resonance apparatus as claimed in claim 12, wherein the controller is configured to determine the heat output information item from input data using (i) a performance model, and/or (ii) a trained artificial intelligence function.

15. The magnetic resonance apparatus as claimed in claim 14, wherein the input data comprises one or more of:

sequence data describing at least one magnetic resonance sequence, examination data describing an examination type, and/or patient data describing a patient to be examined.

* * * * *